(12) United States Patent
Arakawa

(10) Patent No.: US 10,777,594 B2
(45) Date of Patent: Sep. 15, 2020

(54) SOLID-STATE IMAGING ELEMENT, SOLID-STATE IMAGING ELEMENT MANUFACTURING METHOD, AND IMAGING DEVICE

(71) Applicant: SONY SEMICONDUCTOR SOLUTIONS CORPORATION, Kanagawa (JP)

(72) Inventor: Shinichi Arakawa, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/462,334

(22) PCT Filed: Nov. 9, 2017

(86) PCT No.: PCT/JP2017/040359
§ 371 (c)(1),
(2) Date: May 20, 2019

(87) PCT Pub. No.: WO2018/100998
PCT Pub. Date: Jun. 7, 2018

(65) Prior Publication Data
US 2019/0371846 A1 Dec. 5, 2019

(30) Foreign Application Priority Data
Dec. 1, 2016 (JP) .................. 2016-233931

(51) Int. Cl.
*H01L 27/146* (2006.01)
*H04N 5/359* (2011.01)
*H04N 5/353* (2011.01)

(52) U.S. Cl.
CPC .... *H01L 27/14623* (2013.01); *H01L 27/1464* (2013.01); *H01L 27/14609* (2013.01);
(Continued)

(58) Field of Classification Search
CPC ......... H01L 27/14623; H01L 27/14609; H01L 27/1464; H01L 27/14643; H01L 27/14685;
(Continued)

(56) References Cited

U.S. PATENT DOCUMENTS

2011/0108836 A1 5/2011 Koyama et al.
2014/0014816 A1 1/2014 Takeda
(Continued)

FOREIGN PATENT DOCUMENTS

JP 2011-119711 6/2011
JP 2013-065688 4/2013
(Continued)

OTHER PUBLICATIONS

International Search Report prepared by the Japan Patent Office dated Dec. 15, 2017, for International Application No. PCT/JP2017/040359.

*Primary Examiner* — Tong-Ho Kim
(74) *Attorney, Agent, or Firm* — Sheridan Ross P.C.

(57) ABSTRACT

In a global shutter system back-illuminated CMOS image sensor, optical noise is reduced to enhance image quality. A solid-state imaging element is provided that includes: a semiconductor substrate; a photoelectric conversion unit; a charge holding unit; a first penetrating light-shielding film that partitions the photoelectric conversion unit and the charge holding unit from each other; a first bypass part containing a semiconductor material on an outer front surface of the semiconductor substrate; and a control unit that controls charge transfer from the photoelectric conversion unit to the charge holding unit via the first bypass part. A front-side end portion of the first penetrating light-shielding film has, in a thickness direction of the semiconductor substrate, an approximately same length as a front-side end of the charge holding unit or has a longer length than in the
(Continued)

front-side end of the charge holding unit in a front side direction.

15 Claims, 13 Drawing Sheets

(52) U.S. Cl.
CPC .. *H01L 27/14643* (2013.01); *H01L 27/14685* (2013.01); *H04N 5/353* (2013.01); *H04N 5/359* (2013.01); *H01L 27/14621* (2013.01); *H01L 27/14627* (2013.01)

(58) Field of Classification Search
CPC ........ H01L 27/14621; H01L 27/14627; H04N 5/353; H04N 5/359
USPC ........................................ 257/435
See application file for complete search history.

(56) References Cited

U.S. PATENT DOCUMENTS

| 2015/0069471 | A1 | 3/2015 | Kawamura |
| 2015/0124140 | A1* | 5/2015 | Ohkubo ................ H04N 5/374 348/308 |
| 2015/0357363 | A1 | 12/2015 | Kawamura |
| 2016/0020247 | A1 | 1/2016 | Ohri |
| 2017/0200754 | A1 | 7/2017 | Kawamura |
| 2017/0244920 | A1 | 8/2017 | Ohkubo et al. |

FOREIGN PATENT DOCUMENTS

| JP | 2014-022795 | 2/2014 |
| JP | 2014-096390 | 5/2014 |
| JP | 2015-053411 | 3/2015 |
| WO | WO 2014/141898 | 9/2014 |
| WO | WO 2016/136486 | 9/2016 |

* cited by examiner (a)

(b)

(c)

SOLID-STATE IMAGING ELEMENT, SOLID-STATE IMAGING ELEMENT MANUFACTURING METHOD, AND IMAGING DEVICE

CROSS REFERENCE TO RELATED APPLICATIONS

This application is a national stage application under 35 U.S.C. 371 and claims the benefit of PCT Application No. PCT/JP2017/040359 having an international filing date of 9 Nov. 2017, which designated the United States, which PCT application claimed the benefit of Japanese Patent Application No. 2016-233931 filed 1 Dec. 2016, the entire disclosures of each of which are incorporated herein by reference.

TECHNICAL FIELD

The present technology relates to a solid-state imaging element, a solid-state imaging element manufacturing method, and an imaging device.

BACKGROUND ART

A solid-state imaging device is roughly divided into a complementary metal oxide semiconductor (CMOS) image sensor and a charge coupled device (CCD) image sensor.

The shutter system of the CMOS image sensor is divided into two systems, namely, a mechanical shutter system and an electronic shutter system. The CMOS image sensor mounted on a mobile device such as a cellular phone equipped with a camera having been remarkably popularized in recent years mainly employs an electronic shutter system in order to downsize the device.

The electronic shutter system is classified into a rolling shutter system and a global shutter system depending on the exposure system. The rolling shutter system sequentially reads out signals line by line. This system of reading out signals line by line in order involves an occurrence of a "konnyaku phenomenon (in Japanese) meaning rolling shutter distortion" due to a reading time difference occurring between lines within one frame. In contrast, the global shutter system performs simultaneous exposure on an entire frame in the reading, and thus would not cause distortion in an image even when a fast moving object is photographed.

In order to implement simultaneity of storage in individual pixels, the CMOS image sensor of the global shutter system includes a charge holding element (capacitor) for each of the pixels and simultaneously transfers the charges generated in the photoelectric conversion element to the charge holding element to be held in the element, thereby enabling global shutter photographing. However, occurrence of light leak into the charge holding element during the charge holding might cause optical noise and this might lead to degradation of image quality.

Patent Documents 1 and 2 disclose technologies for implementing the global shutter system in a back-illuminated CMOS image sensor and suppressing the above-described optical noise. The solid-state imaging element disclosed in each of these documents includes a light shielding metal that covers the charge holding element from the light incident side, thereby providing a structure in which the light shielding metal extends along a region between the charge holding element and a photoelectric conversion unit.

CITATION LIST

Patent Document

Patent Document 1: Japanese Patent Application Laid-Open No. 2013-65688
Patent Document 2: Japanese Patent Application Laid-Open No. 2014-96390

SUMMARY OF THE INVENTION

Problems to be Solved by the Invention

In the solid-state imaging element in Patent Document 1 described above, a light-shielding film extending between the charge holding unit and the photoelectric conversion unit does not penetrate through a silicon substrate. Accordingly, part of diagonally incident light might be incident on the charge holding unit at a portion close to a back surface of the silicon substrate, leading to a possibility that a charge generated by photoelectric conversion at the charge holding unit turns into optical noise.

The solid-state imaging element in Patent Document 2 described above enables a light-shielding film extending as a contact for transferring charges between the charge holding element and the photoelectric conversion unit to have a penetrating-type metal light-shielding film structure, so as to prevent light leakage into the charge holding region and suppress generation of a virtual image. Unfortunately, however, the technology described in Patent Document 2 provides metal wiring outside the silicon to connect the photoelectric conversion unit and the charge holding unit, and this configuration easily picks up noise onto the metal wiring, leading to the possibility of deterioration of the image quality characteristics.

The present technology has been made in view of the above problems, and aims to reduce optical noise and improve image quality in a global shutter type back-illuminated CMOS image sensor.

Solutions to Problems

One aspect of the present technology is a solid-state imaging element including: a semiconductor substrate; a photoelectric conversion unit that photoelectrically converts incident light from a back surface of the semiconductor substrate; a charge holding unit that temporarily holds a charge generated by the photoelectric conversion unit; a first penetrating light-shielding film penetrating through front and back surfaces of the semiconductor substrate so as to partition the photoelectric conversion unit and the charge holding unit from each other; a first bypass part containing a semiconductor material and provided on an outer front surface of the semiconductor substrate so as to connect the photoelectric conversion unit and the charge holding unit with each other across the first penetrating light-shielding film; and a control unit that controls charge transfer from the photoelectric conversion unit to the charge holding unit via the first bypass part, in which a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

Another aspect of the present technology is a solid-state imaging element manufacturing method, including: a step of forming, on a semiconductor substrate, a photoelectric conversion unit that photoelectrically converts incident light from a back surface of the semiconductor substrate; a step of forming a charge holding unit that temporarily holds a charge generated by the photoelectric conversion unit; a step of forming a first penetrating light-shielding film penetrating through front and back surfaces of the semiconductor substrate so as to partition the photoelectric conversion unit and the charge holding unit from each other; a step of forming a first bypass part containing a semiconductor material and provided on an outer front surface of the semiconductor substrate so as to connect the photoelectric conversion unit and the charge holding unit with each other across the first penetrating light-shielding film; and a step of forming a control electrode that controls charge transfer from the photoelectric conversion unit to the charge holding unit via the first bypass part, in which a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

Another aspect of the present technology is an imaging device including a solid-state imaging element and a signal processing circuit that processes a signal from the solid-state imaging element, in which the solid-state imaging element includes: a semiconductor substrate; a photoelectric conversion unit that photoelectrically converts incident light from a back surface of the semiconductor substrate; a charge holding unit that temporarily holds a charge generated by the photoelectric conversion unit; a first penetrating light-shielding film penetrating through front and back surfaces of the semiconductor substrate so as to partition the photoelectric conversion unit and the charge holding unit from each other; a first bypass part containing a semiconductor material and provided on an outer front surface of the semiconductor substrate so as to connect the photoelectric conversion unit and the charge holding unit with each other across the first penetrating light-shielding film; and a control unit that controls charge transfer from the photoelectric conversion unit to the charge holding unit via the first bypass part, and a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

Note that the solid-state imaging element described above includes various modes of being implemented in a state of being incorporated in another device, being implemented together with other methods, or the like. Furthermore, the present technology can also be implemented as an imaging device including the solid-state imaging element, a method of manufacturing the solid-state imaging element described above.

Effects of the Invention

According to the present technology, it is possible to reduce optical noise and improve image quality in the global shutter system back-illuminated CMOS image sensor. Note that effects described in the present description are provided for purposes of exemplary illustration and are not intended to be limiting. Still other additional effects may also be contemplated.

MODE FOR CARRYING OUT THE INVENTION

Hereinafter, the present technology will be described in the following order.

(A) First embodiment:
(B) Second Embodiment:
(C) Third embodiment:
(D) Fourth Embodiment:
(E) Fifth embodiment:
(F) Sixth Embodiment:
(G) Seventh embodiment:

(A) First Embodiment

Figure 1:
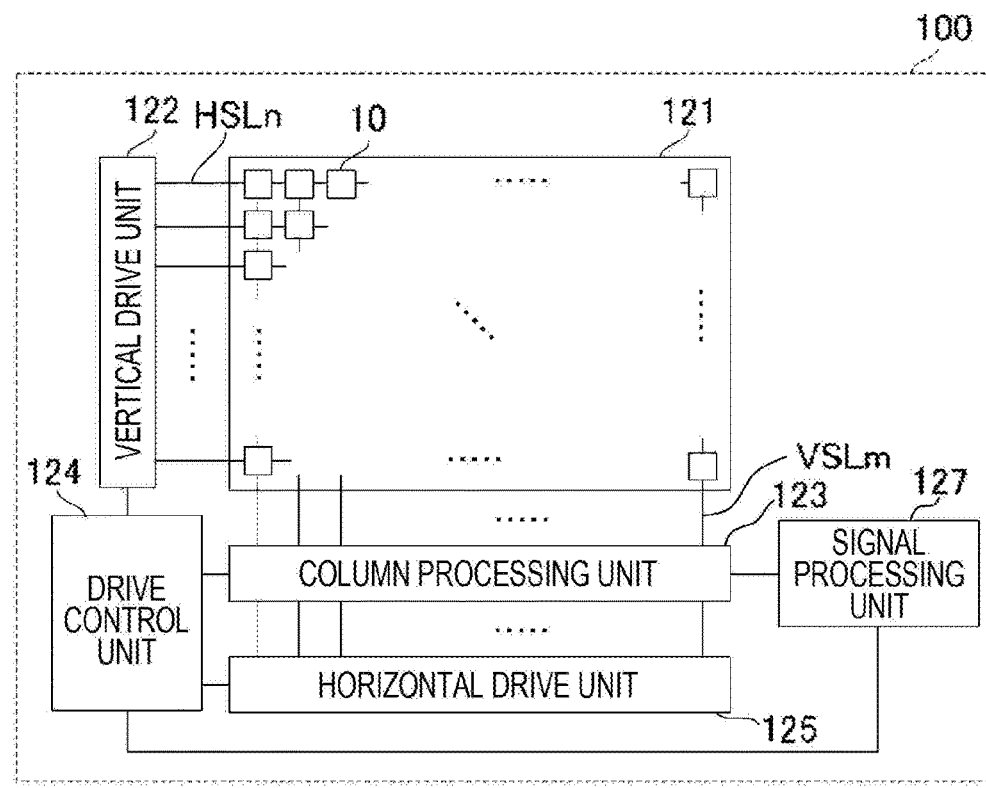
FIG. 1 is a diagram illustrating a schematic configuration of a solid-state imaging element according to a first embodiment.

FIG. 1 is a diagram illustrating a schematic configuration of a solid-state imaging element 100 according to the present embodiment.

The solid-state imaging element 100 is implemented by a CMOS solid-state imaging element, and includes a pixel array unit 121, a vertical drive unit 122, a column processing unit 123, a horizontal drive unit 125, an output unit 127, and a drive control unit 124.

The pixel array unit 121 includes a plurality of pixels 10 arranged in an array. The pixels 10 are connected to the vertical drive unit 122 via a plurality of horizontal signal lines HSLn corresponding to the number of rows of the pixels 10, and are connected to the column processing unit 123 via a plurality of vertical signal lines VSLm corresponding to the number of columns of the pixels 10. That is, the plurality of pixels 10 included in the pixel array unit 121 is arranged at each of points where the horizontal signal line HSLn and the vertical signal line VSLm intersect each other.

The vertical drive unit 122 sequentially supplies a drive signal (a transfer signal, a selection signal, a reset signal, or the like) for driving the individual pixels 10 to each of rows of the plurality of pixels 10 included in the pixel array unit 121 via the horizontal signal line HSLn.

The column processing unit 123 applies, via the vertical signal line VSLm, correlated double sampling (CDS) processing on the pixel signal output from each pixel 10, and thereby extracts the signal level of the pixel signal and obtains pixel data corresponding to the amount of light received by the pixel 10.

The horizontal drive unit 125 sequentially supplies to the column processing unit 123 a drive signal for causing the column processing unit 123 to output the pixel data obtained from each of the pixels 10 for each of columns of the plurality of pixels 10 included in the pixel array unit 121.

Pixel data is supplied to the output unit 127 from the column processing unit 123 at a timing according to the drive signal of the horizontal drive unit 125, and the output unit 127 amplifies the pixel data to the image processing circuit at a later stage, for example.

The drive control unit 124 controls driving of each of blocks inside the solid-state imaging element 100. For example, the drive control unit 124 generates a clock signal according to the driving cycle of each of the blocks and supplies the generated clock signal to each of the blocks.

Figure 2:
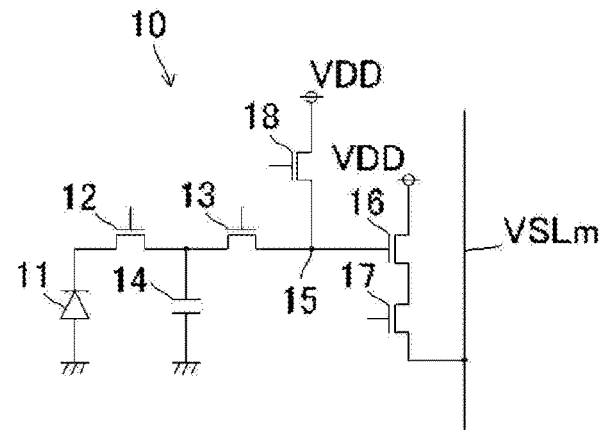
FIG. 2 is a circuit diagram illustrating a configuration example of a pixel.

FIG. 2 is a circuit diagram illustrating a configuration example of the pixel 10.

As illustrated in FIG. 2, the pixel 10 includes a PD 11, a first transfer transistor 12, a second transfer transistor 13, a charge holding unit 14, a floating diffusion (FD) 15, an amplification transistor 16, a selection transistor 17, and a reset transistor 18. Hereinafter, the first transfer transistor 12, the second transfer transistor 13, the charge holding unit 14, the amplification transistor 16, the selection transistor 17, and the reset transistor 18 will be collectively referred to as a pixel transistor in some cases.

The PD 11 receives the light emitted to the pixel 10, and generates and accumulates charges corresponding to the light amount.

The first transfer transistor 12 is driven in accordance with a transfer signal supplied from the vertical drive unit 122. When the first transfer transistor 12 is turned on, charges accumulated in the PD 11 are transferred to the charge holding unit 14.

The second transfer transistor 13 is driven in accordance with a transfer signal supplied from the vertical drive unit 122. When the second transfer transistor 13 is turned on, charges accumulated in the charge holding unit 14 are transferred to the FD 15.

The charge holding unit 14 is a capacitor that accumulates charges transferred from the PD 11 via the first transfer transistor 12.

The FD 15 is a floating diffusion region having a predetermined capacitance and is formed at a point connecting the second transfer transistor 13 with a gate electrode serving as a control electrode of the amplification transistor 16. The FD 15 accumulates charges transferred from the charge holding unit 14 via the second transfer transistor 13.

The amplification transistor 16 is connected to a power supply VDD and outputs a pixel signal of a level corresponding to the charge accumulated in the FD 15.

The selection transistor 17 is driven in accordance with a selection signal supplied from the vertical drive unit 122. When the selection transistor 17 is turned on, the pixel signal output from the amplification transistor 16 turns to a state of being ready to be read out to the vertical signal line VSLm via the selection transistor 17.

The reset transistor 18 is driven in accordance with the reset signal supplied from the vertical drive unit 122. When the reset transistor 18 is turned on, the charge accumulated in the FD 15 is discharged to the power supply VDD via the reset transistor 18, and the FD 15 is reset.

The solid-state imaging element 100 having the pixels 10 configured as described above employs the global shutter system. Accordingly, the solid-state imaging element 100 can transfer the charges simultaneously from the PD 11 to the charge holding unit 14 in all the pixels 10, making it possible to set identical exposure timing for all the pixels 10. This makes it possible to avoid occurrence of distortion in the image.

Figure 3:
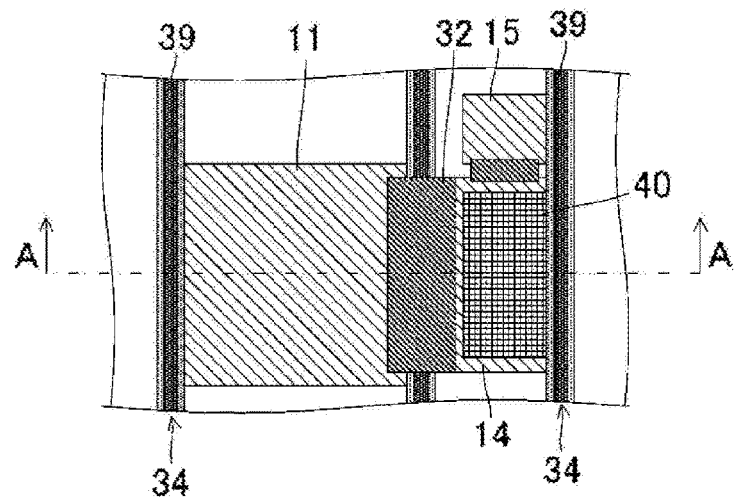
FIG. 3 is a view illustrating a planar configuration example of a pixel.
Figure 4:
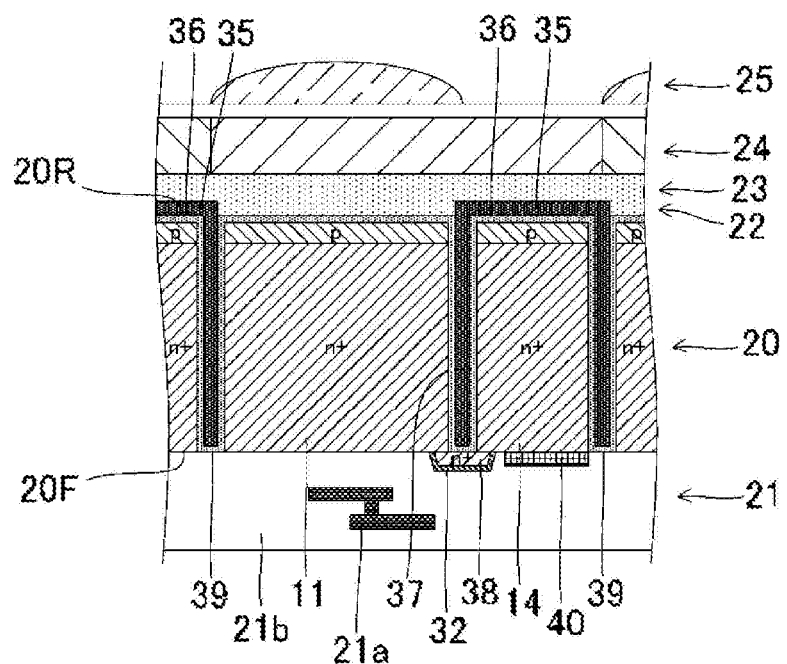
FIG. 4 is a view illustrating a cross-sectional configuration example of a pixel in A-A cross section of FIG. 3.

FIG. 3 is a view illustrating a planar configuration example of the pixel 10. FIG. 4 is a view illustrating a cross-sectional configuration example of the pixel 10 in cross section A-A of FIG. 3. The pixel 10 has a back-illuminated configuration.

The pixel 10 illustrated in FIG. 3 has a planar arrangement including: the PD 11 as a photoelectric conversion unit that photoelectrically converts incident light from the back surface of the semiconductor substrate 20; the charge holding unit 14 that temporarily holds the charge generated by the PD 11; and the FD 15. Hereinafter, in the pixel 10, a region where the PD 11 of the semiconductor substrate 20 is formed will be referred to as a PD region, and a region where the charge holding unit 14 is formed in the semiconductor substrate 20 will be referred to as a charge holding region in some cases.

The pixel 10 has a configuration in which a wiring layer 21, a semiconductor substrate 20, a light shielding layer 22, a planarizing layer 23, a color filter layer 24, and an on-chip lens 25 are stacked in this order from the bottom in FIG. 4. Note that the color filter layer 24 may be directly stacked on the semiconductor substrate 20 or the light shielding layer 22 without providing the planarizing layer 23.

The solid-state imaging element 100 includes a structure of a back-illuminated CMOS image sensor on which incident light is emitted to a back surface 20P, as an opposite surface to a front surface 20F onto which the wiring layer 21 of the semiconductor substrate 20 is stacked.

The wiring layer 21 has a plurality of wires 21a for performing charge readout or the like of the PD 11 of the semiconductor substrate 20, embedded in an interlayer insulating film 21b. On the lower side of the wiring layer 21, for example, a substrate support material (not illustrated) is provided.

The wiring layer 21 includes a gate electrode 32 that constitutes the first transfer transistor 12. The gate electrode 32 is arranged via an insulating oxide film (not illustrated) with respect to the semiconductor substrate 20. Application of a predetermined voltage to the gate electrode 32 would allow the charge accumulated in the PD 11 to be transferred to the charge holding unit 14.

The semiconductor substrate 20 includes an N-type region constituting the PD 11 and an N-type region constituting the charge holding unit 14. The N-type region constituting the PD 11 and the N-type region constituting the charge holding unit 14 are formed at a position near the front surface 20F of the semiconductor substrate 20. It is allowable to provide a surface pinning layer of a P-type region on the back surface side of the PD 11 and the charge holding unit 14 and the front surface side of the charge holding unit 14.

The semiconductor substrate 20 includes an inter-pixel separation region 34 that separates the pixel 10 from another adjacent pixel 10 so as to surround the periphery of the pixel 10.

The light shielding layer 22 has a configuration in which the back surface light-shielding film 35 including a material having a light shielding property is embedded in the high dielectric constant material film 36. For example, the back surface light-shielding film 35 contains a material such as tungsten (W), aluminum (Al), and copper (Cu), and is connected to a GND (not illustrated). The high dielectric constant material film 36 contains a material such as silicon dioxide ($SiO_2$), hafnium oxide ($HfO_2$), tantalum pentoxide ($Ta_2O_5$), and zirconium dioxide ($ZrO_2$).

The semiconductor substrate 20 includes a penetrating light-shielding film 37 as a first penetrating light-shielding film provided between the PD 11 of the pixel 10 and the charge holding unit 14. The penetrating light-shielding film 37 is formed by depositing a high dielectric constant material film over an entire inner surface of a through hole provided in the semiconductor substrate 20 and filling a light shielding material in the through hole. The high dielectric constant material film and the material having light shielding properties are similar to the case of the above-described back surface light-shielding film 35. The penetrating light-shielding film 37 penetrates through the front and back surfaces of the semiconductor substrate 20 and has a structure to partition the PD 11 and the charge holding unit 14 from each other. The front-side end portion of the penetrating light-shielding film 37 is formed in the thickness direction of the semiconductor substrate 20 to be substantially equal to the front-side end portion of the charge holding unit 14 or longer in the front side direction than the front-side end portion of the charge holding unit 14. With this configuration having the penetrating light-shielding film 37, incident light from the back surface 20R side of the semiconductor substrate 20 to the PD 11 would not diagonally be incident onto the charge holding unit 14.

In FIG. 3, at least a portion of the charge holding unit 14 is located on the side opposite to the PD 11 across the penetrating light-shielding film 37, and at least a portion of a formation range of the PD 11 and a formation range of the charge holding unit 14 overlap each other in an extending direction of the penetrating light-shielding film 37. Providing a bypass part 38 in this overlapping portion, it is possible to minimize the connection length between the PD 11 and the charge holding unit 14.

In the semiconductor substrate 20, the inter-pixel separation region 34 between the pixel 10 and another adjacent pixel includes a penetrating light-shielding film 39. The structure and material of the penetrating light-shielding film 39 are similar to the case of the penetrating light-shielding film 37 described above. The penetrating light-shielding film 39 penetrates the front and back surfaces of the semiconductor substrate 20 and partitions the pixel 10 from another pixel. With this configuration, the incident light from the back surface 20R side of the semiconductor substrate 20 to the PD 11 of the pixel 10 would not diagonally be incident on adjacent another pixel 10.

The light shielding layer 22 includes a back surface light-shielding film 35 for covering the back surface side of the charge holding unit 14. The back surface light-shielding film 35 is formed along the back surface 20R on the back surface 20R side of the semiconductor substrate 20 at a site where the charge holding unit 14 is provided. A PD-11 side edge portion of the back surface light-shielding film 35 is continuous to a back-surface side end portion of the penetrating light-shielding film 37. The other edge portion of the back surface light-shielding film 35 is continuous to the back surface-side end portion of the penetrating light-shielding film 39. That is, except for the side facing the front surface 20F of the semiconductor substrate 20, the charge holding unit 14 is optically closed by the presence of the back surface light-shielding film 35 and the penetrating light-shielding films 37 and 39. Note that the high dielectric constant material film provided so as to wrap, in a small thickness, the penetrating light-shielding films 37 and 39 formed in the semiconductor substrate 20. Moreover, the high dielectric constant material film is also provided between the back surface light-shielding film 35 and the semiconductor substrate 20. This results in continuous formation of these high dielectric constant material films with a high dielectric constant film covering the outside of the penetrating light-shielding films 37 and 39.

The bypass part 38 connects the PD 11 and the charge holding unit 14 on the outside of the front surface 20F of the semiconductor substrate 20. The bypass part 38 includes a semiconductor material doped with an N-type impurity, and extending across the front surface 20F of the semiconductor substrate 20 at a site including the penetrating light-shielding film 37. Examples of the semiconductor material constituting the bypass part 38 include SiGe, InGaAs, or the like, besides silicon. In short, the bypass part 38 is formed in positions and ranges including formation ranges of the penetrating light-shielding film 37, the PD 11, and the charge holding unit 14 individually. The bypass part 38 includes a P-type region 38b (refer to FIG. 5) doped with a P-type impurity along a front surface coming in contact with the gate electrode 32. The P-type region 38b serves as a channel region to link between a N-type region 38a (refer to FIG. 5) doped with an N-type impurity and the gate electrode 32, resulting in serving as a charge transfer path for transferring charges from the PD 11 to the charge holding unit 14.

Figure 5:
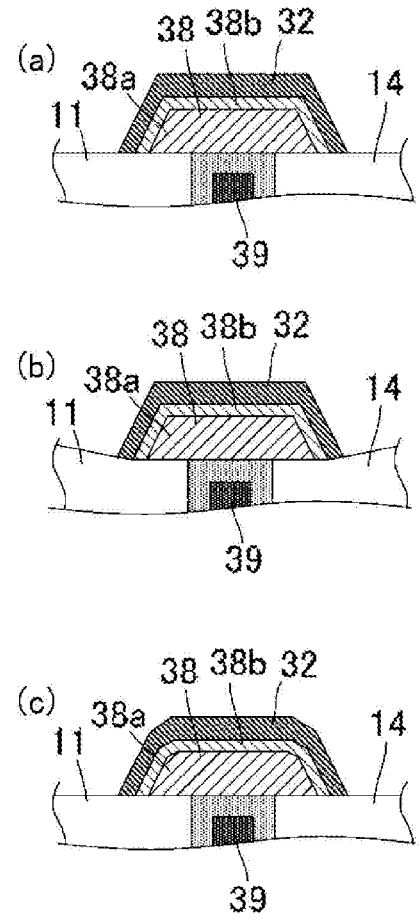
FIG. 5 is a view illustrating a specific example of a shape of a bypass part taken along line A-A in FIG. 3.
Figure 6:
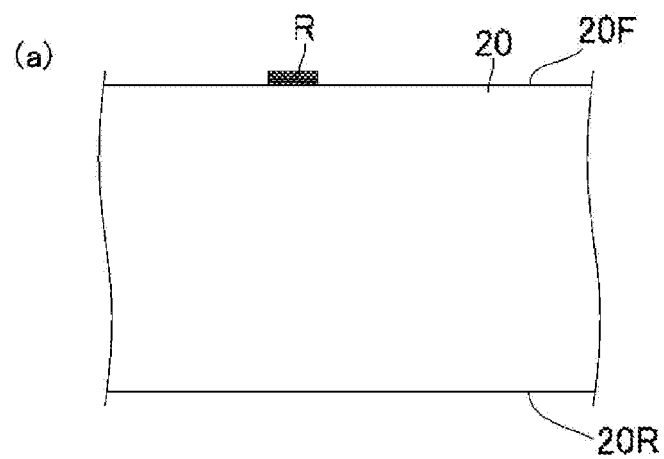
FIG. 6 is a view illustrating a flow according to an example of a method of manufacturing a solid-state imaging element.
Figure 6:
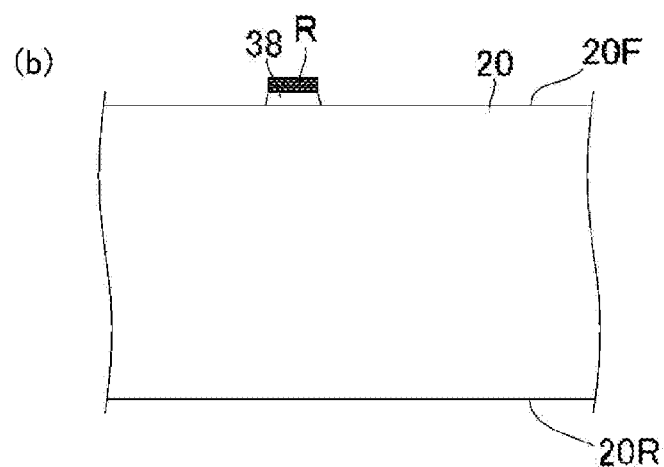
Figure 6:
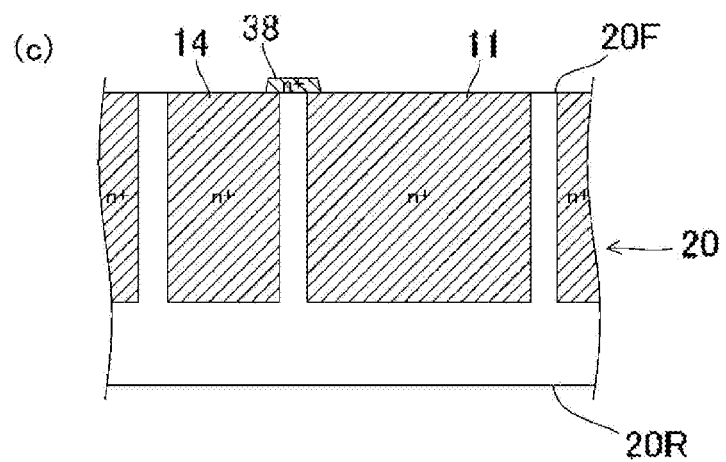
Figure 7:
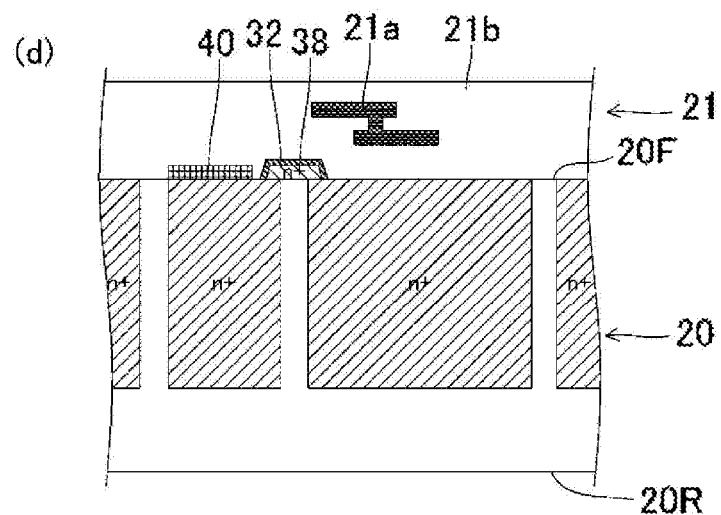
FIG. 7 is a view illustrating a flow according to an example of a method of manufacturing a solid-state imaging element.
Figure 7:
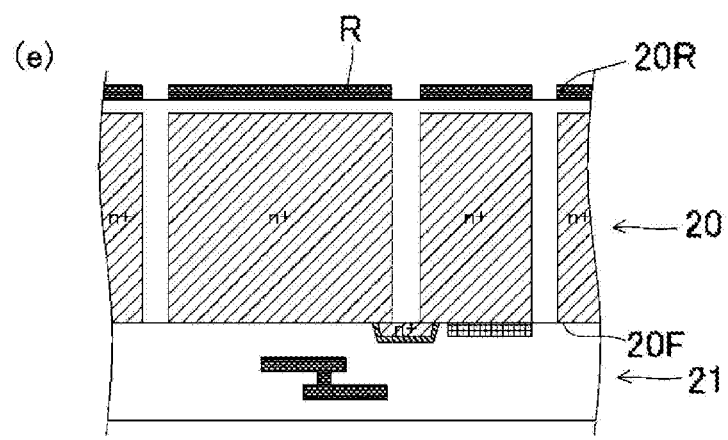
Figure 7:
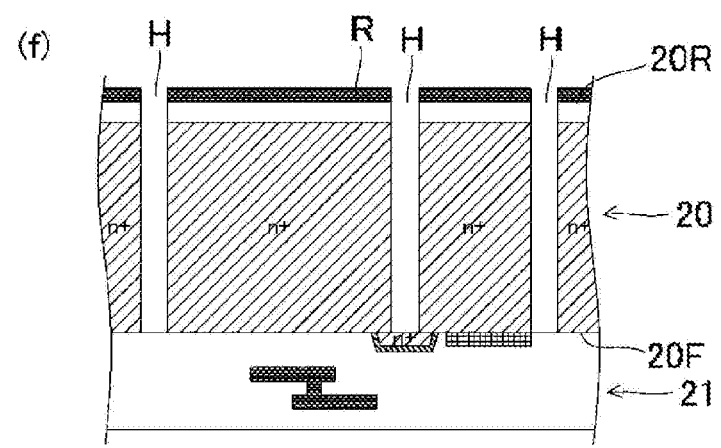
Figure 8:
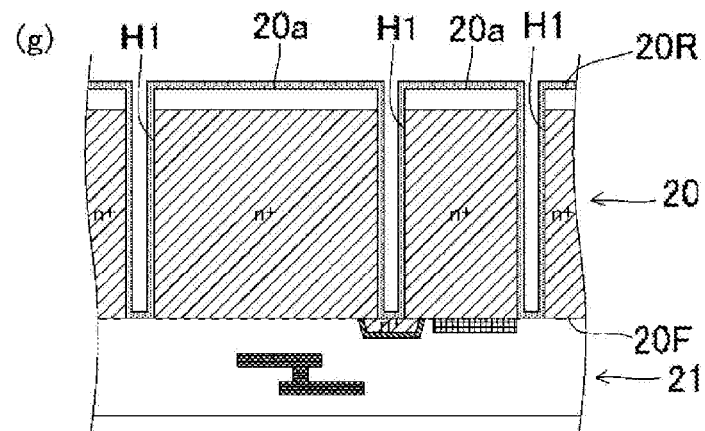
FIG. 8 is a view illustrating a flow according to an example of a method of manufacturing a solid-state imaging element.
Figure 8:
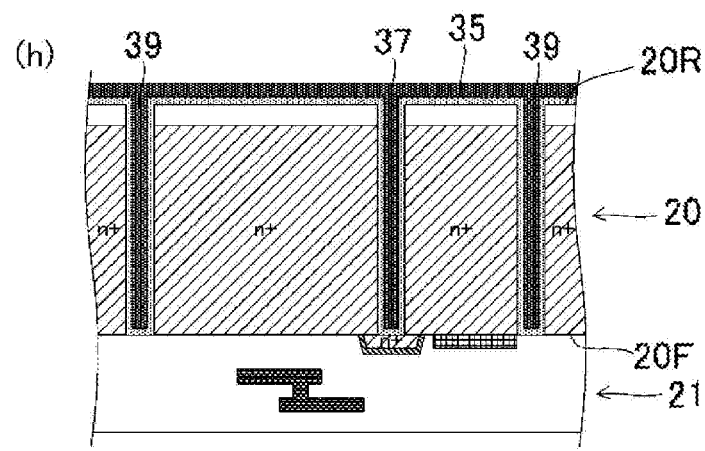
Figure 8:
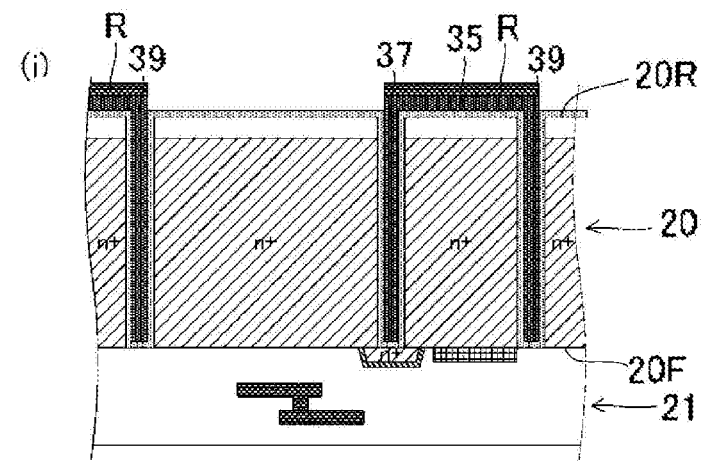
Figure 9:
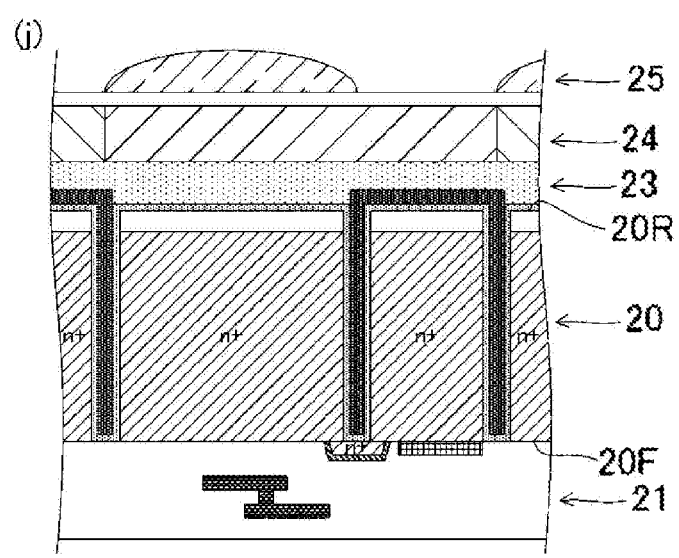
FIG. 9 is a view illustrating a flow according to an example of a method of manufacturing a solid-state imaging element.

FIG. 5 is a view illustrating a specific example of a shape of the bypass part 38 taken along A-A cross section. In the specific example illustrated in FIG. 5(a), the bypass part 38 has a tapered side surface extending in a direction substantially orthogonal to the front surface 20F of the semiconductor substrate 20, and has a trapezoidal cross-sectional shape having its long side facing the semiconductor substrate 20 side. In the specific example illustrated in FIG. 5(b), the basic shape of the bypass part 38 is similar to the case of the specific example illustrated in FIG. 5(a), except that the shape includes, on both sides of the bypass part 38, a trench shaped portion recessed in the front surface 20F of the semiconductor substrate 20. In the specific example illustrated in FIG. 5(c), the basic shape of the bypass part 38 is similar to the specific example illustrated in FIG. 5(a), except that the shape includes round-off corners on the short side of the trapezoidal cross-sectional shape of the bypass part 38. As illustrated in these specific examples, forming the corners to have obtuse angles makes it possible to avoid concentration of electric fields, leading to enhanced transfer efficiency.

The gate electrode 32 as a control unit that controls charge transfer from the PD 11 to the charge holding unit 14 via the bypass part 38 is formed outside the front surface 20F of the semiconductor substrate 20. The gate electrode 32 can be implemented by employing a polysilicon gate, a metal gate using a high-k insulating film, or the like. The gate electrode 32 is formed along the front side and the side surface of the bypass part 38, and is provided at a position and shape extending across the penetrating light-shielding film 37. Application of a predetermined voltage to the gate electrode 32 would allow the charge accumulated in the PD 11 to be transferred to the charge holding unit 14.

The front surface 20F of the semiconductor substrate 20 corresponding to the charge holding unit 14 includes a memory gate 40. Applying a voltage to the memory gate 40 would change the potential of the charge holding unit 14, leading to enhancement of the charge transfer efficiency from the PD 11 to the charge holding unit 14. This makes it possible to suppress noise and image persistence during charge transfer.

The solid-state imaging element 100 configured as described above makes it possible to suppress the leakage of light into the charge holding unit 14 and possible to reduce noise components at the time of transfer, leading to achievement of remarkably excellent characteristics compared with the conventional structures.

Next, an exemplary method of manufacturing the solid-state imaging element 100 will be described. FIGS. 6 to 10 are views illustrating a flow according to an exemplary method of manufacturing the solid-state imaging element 100.

First, a lithography technology is utilized to pattern a resist R on a site of the front surface 20F of the semiconductor substrate 20 where the bypass part 38 is to be provided (FIG. 6(a)). Next, dry etching is performed to uniformly etch off the front surface 20F of the semiconductor substrate 20 not covered with the resist R (FIG. 6(b)). It is sufficient to determine an etch-off depth to any depth as long as the thickness suitable for the bypass part 38 can be obtained. Specific example of the thickness can be in a range of 50 nm to 300 nm. After the etch-off of the front surface 20F of the semiconductor substrate 20, the resist R is stripped and removed. This process forms the bypass part 38 in the form of embankment on the protrusion remaining on the front surface 20F of the semiconductor substrate 20. Note that the trench shape illustrated in FIG. 5(b) described above is formed in this dry etching when the processed edge becomes locally deep depending on the processing condition. Note that damages due to the use of plasma in dry etching can be recovered by execution of high temperature heat treatment at 1000° C. or more after processing.

Next, ion implantation suitable for the bypass part 38, the PD 11, and the charge holding unit 14 is performed (FIG. 6(c)). Ion implantation is performed so as to achieve the bypass part 38, the PD 11, and the charge holding unit 14 of the first conductivity type ($N^+$ type in the present embodiment). Furthermore, ion implantation suitable for the pixel transistor is also performed, although not illustrated. Note that for the front surface 20F and the back surface 20R of the semiconductor substrate 20 corresponding to the formation regions of the charge holding unit 14 and the PD 11, it is allowable to form a pinning layer of a second conductivity type ($P^+$ type in the present embodiment) by ion implantation so as to suppress generation of a charge on the front surface 20F and the back surface 20R of the semiconductor substrate 20.

Next, an insulating oxide film is stacked on the front surface 20F of the semiconductor substrate 20 (not illustrated), and in a predetermined position above this, a gate electrode of the pixel transistor is formed. Above this, the plurality of wires 21a and the interlayer insulating film 21b of the wiring layer 21 are sequentially stacked (FIG. 7(d)). Thereafter, although not illustrated, it is also allowable to bond a substrate support material (support substrate or the like) to the front surface side of the wiring layer 21, invert the entire surface, polish and grind from the back surface 20R side to a portion near the back side of the PD 11 of the semiconductor substrate 20 so as to achieve thinning of the semiconductor substrate 20. Note that the substrate support material may include a logic circuit, a memory element, or the like. In this case, a penetrating electrode penetrating from the semiconductor substrate 20 to the substrate support material is formed, so as to electrically connect the predetermined wires 21a of the wiring layer 21 with the logic circuit, the memory element, or the like.

Next, the resist R is patterned on the back surface 20R of the semiconductor substrate 20 by lithography (FIG. 7(e)), and then, dry etching is performed to form a through hole H penetrating the semiconductor substrate 20 from the back surface 20R side to the front surface 20F side (FIG. 7(f)). After forming the through hole H, the resist R is stripped and removed. Thereafter, a high dielectric constant material is deposited on an inner side surface H1 of the through hole H and on a flat portion 20a of the back surface 20R of the semiconductor substrate 20 (FIG. 8(g)). The high dielectric constant material can be formed by, for example, a single film of an oxide film ($SiO_2$), hafnium oxide (HfOx), tantalum oxide (TaOx), zirconium oxide (ZrOx), or a film on which these materials are stacked. Thereafter, a metallic material is filled in the through hole H to form the penetrating light-shielding films 37 and 39, and together with this, a metal material is stacked on the flat portion 20a of the back surface 20R of the semiconductor substrate 20 to form the back surface light-shielding film 35 (FIG. 8(h)). Examples of the metal material include a single film of tungsten (W), aluminum (Al), copper (Cu), titanium (Ti), titanium nitride (TiN), tungsten nitride (WN), or a stacked film of these materials.

Next, the resist R is patterned on the back surface light-shielding film 35 by lithography, and then dry etching is performed to remove a portion of the back surface light-shielding film 35 necessary for the purpose, so as to form an opening (FIG. 8(i)). In the present embodiment, the opening is formed in a site corresponding to the PD region, that is, formation region of the PD 11.

Next, the planarizing layer 23 for planarizing the unevenness of the back surface light-shielding film 35 is formed, and above this layer, the color filter layer 24 and the on-chip lens 25 are sequentially formed (FIG. 9(j)). The planarizing layer 23 is formed, for example, by using a spin coating method to deposit a thermoplastic resin on the back surface light-shielding film 35 and thereafter performing heat curing treatment. The color filter layer 24 is formed by applying a coating liquid containing a coloring material such as a pigment or a dye and a photosensitive resin by using a coating method such as a spin coating method to form a coating film and then using lithography to apply pattern processing on the coating film. The on-chip lens 25 is formed by depositing a positive-acting photoresist film on the color filter layer 24 and then processing the film.

With execution of the above steps, it is possible to produce the solid-state imaging element 100 according to the first embodiment having the global shutter function.

Figure 10:
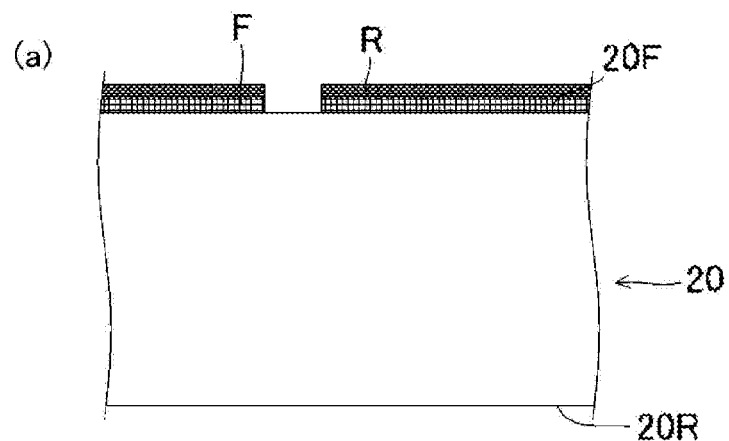
FIG. 10 is a view illustrating a flow according to an example of a method of manufacturing a solid-state imaging element.
Figure 10:
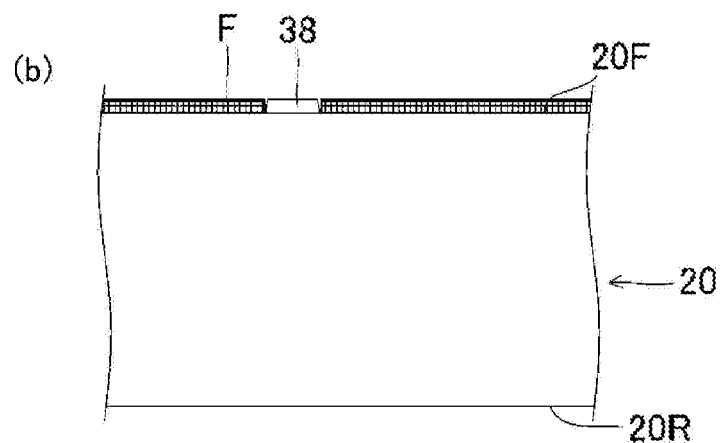
Figure 10:
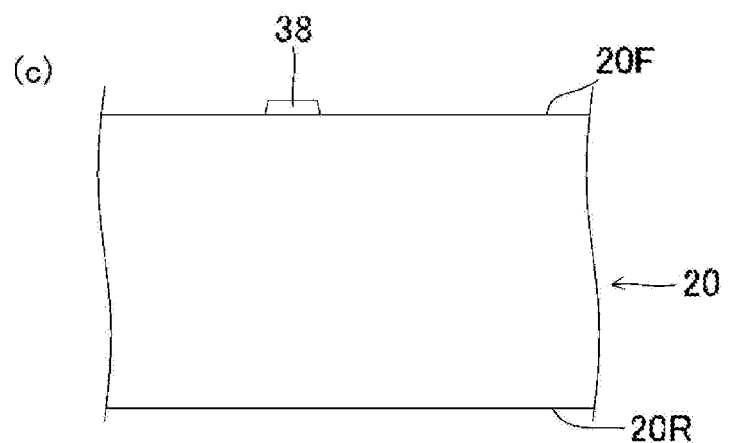

Note that while the manufacturing method described above forms the bypass part 38 by lithography and dry etching, the bypass part 38 can also be formed by vapor phase epitaxy. FIGS. 10(*a*) to 10(*c*) are views illustrating a manufacturing method in a case where the bypass part 38 is formed by vapor phase epitaxy.

In this case, the insulating film F is formed on the front surface 20F of the semiconductor substrate 20. Next, lithography is performed to pattern the resist R having an opening at a site on the insulating film F where the bypass part 38 is to be provided, and dry etching is performed to etch off and remove the insulating film F not covered by the resist R so as to form an opening (FIG. 10(*a*)). The insulating film F is typically formed by using SiO and SiN. Still, there is no limitation as long as the selectivity can be ensured at the time of deposition by vapor phase epitaxy. Subsequently, native oxides on the front surface 20F of the semiconductor substrate 20 are removed by wet treatment or hydrogen reduction to perform epitaxial deposition of a semiconductor material such as silicon (FIG. 10(*b*)). The Si epitaxial deposition is performed by using Si—H—Cl gas, for example, and it is possible to control the growth rate and shape by adjusting a H/Cl ratio. Formation of the facet shape illustrated in FIG. 5(*c*) described above is achieved by application of the vapor phase epitaxy. In this case, a plurality of Si planes is obtained in accordance with processing conditions, thereby forming the facets. Thereafter, the insulating film F is removed, leading to a state where the bypass part 38 is formed at a predetermined position on the front surface 20F of the semiconductor substrate 20 (FIG. 10(*c*)). With this procedure, the bypass part 38 is formed as a stacked protrusion formed in an embankment shape by selective epitaxial growth on the front surface 20F of the semiconductor substrate 20.

(B) Second Embodiment

A solid-state imaging element 200 according to the present embodiment has a configuration similar to the configuration of the above-described solid-state imaging element 100 except for the difference in the positional relationship and shape of the PD, the charge holding unit, the bypass part, or the like in the pixel.

Accordingly, the positional relationship and shape of the PD 211, a charge holding unit 214, a bypass part 238, or the like, of a pixel 210 of the solid-state imaging element 200 will mainly be described below, and detailed description of the other components will be omitted. In the following, reference signs having additional numbers "2" to the heads of the signs of the configuration of the solid-state imaging element 100 will be used as necessary. Note that the basic functions of the PD 211, the charge holding unit 214, the bypass part 238, or the like are similar to the functions of the PD 11, the charge holding unit 14, the bypass part 38, or the like.

Figure 11:
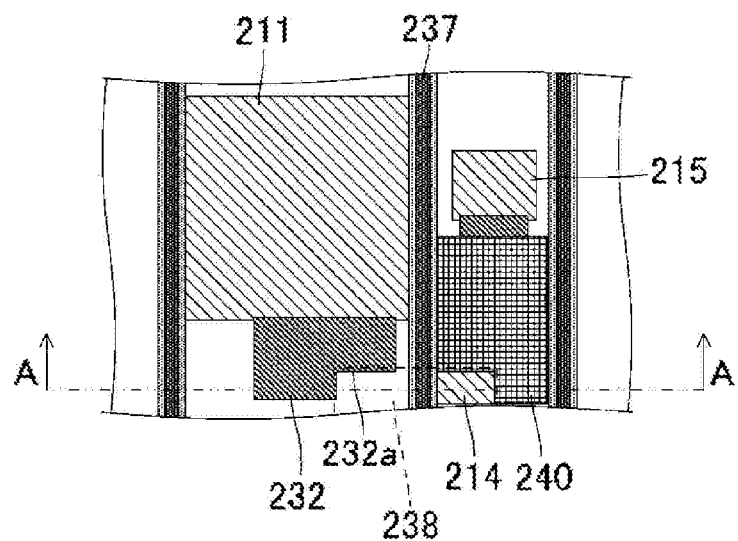
FIG. 11 is a view illustrating a planar configuration example of a pixel according to a second embodiment.
Figure 12:
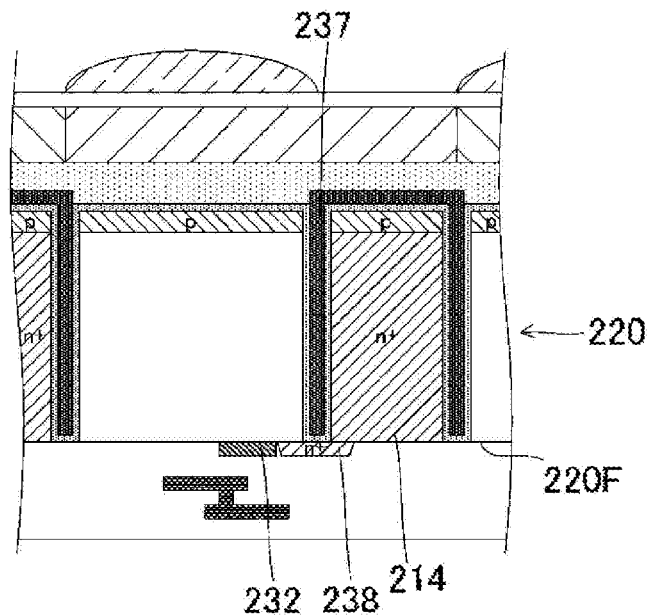
FIG. 12 is a view illustrating a cross-sectional configuration example of a pixel in A-A cross section of FIG. 11.

FIG. 11 is a view illustrating a planar configuration example of the pixel 210. FIG. 12 is a view illustrating a cross-sectional configuration example of the pixel 210 in cross section A-A of FIG. 11.

In FIG. 11, the entire gate electrode 232 of the first transfer transistor 212 is provided on the same side as the PD 211 across the penetrating light-shielding film 237, in a positional relationship so as to be adjacent to the PD 211 while partly overlapping with the formation of the PD 211. The gate electrode 232 includes a recess 232*a* that is not adjacent to the PD 211 and having a partially recessed corner portion as a cutout portion on the side facing the penetrating light-shielding film 237. In this manner, the gate electrode 232 is provided at a position not corresponding to the penetrating light-shielding film 237 on the bypass part 238.

The bypass part 238 connects the gate electrode 232 and the charge holding unit 214 so as to extend across the penetrating light-shielding film 237 on the outside of the front surface 220F of the semiconductor substrate 220. The bypass part 238 is formed in a range including an edge portion of the recess 232*a* and extending toward the charge holding unit 214 side across the penetrating light-shielding film 237.

In FIG. 11, at least a portion of the charge holding unit 214 is located on the side opposite to the gate electrode 232 across the penetrating light-shielding film 237, and at least a portion of a formation range of the gate electrode 232 and a formation range of the charge holding unit 214 overlap each other in an extending direction of the penetrating light-shielding film 237.

This configuration enables the bypass part 238 to function as a charge transfer path that transfers a charge from the PD 211 to the charge holding unit 214 via a channel formed under the gate electrode 232.

(C) Third Embodiment

A solid-state imaging element 300 according to the present embodiment has a configuration similar to the configuration of the above-described solid-state imaging element 100 except for the difference in the shape of the gate electrode in the pixel.

Accordingly, the shape of the gate electrode 332 of the pixel 310 of the solid-state imaging element 300 will mainly be described below, and detailed description of the other components will be omitted. In the following, reference signs having additional numbers "3" to the heads of the signs of the configuration of the solid-state imaging element 100 will be used as necessary. Note that the basic function of the gate electrode 332 is similar to the function of the gate electrode 32.

Figure 13:
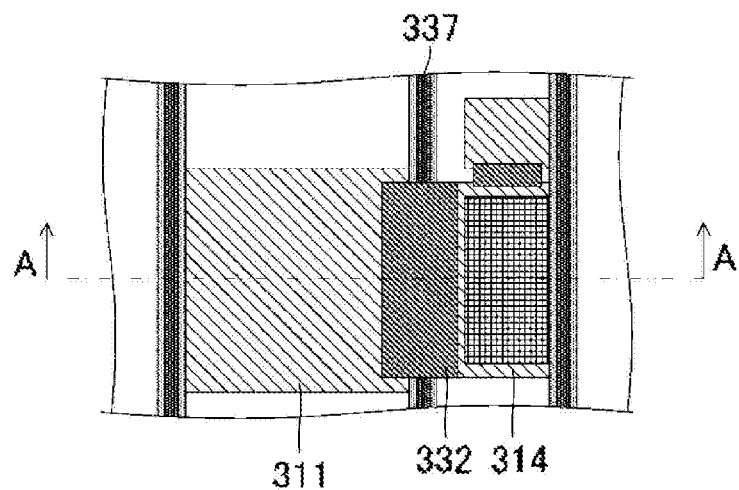
FIG. 13 is a view illustrating a planar configuration example of a pixel according to a third embodiment.
Figure 14:
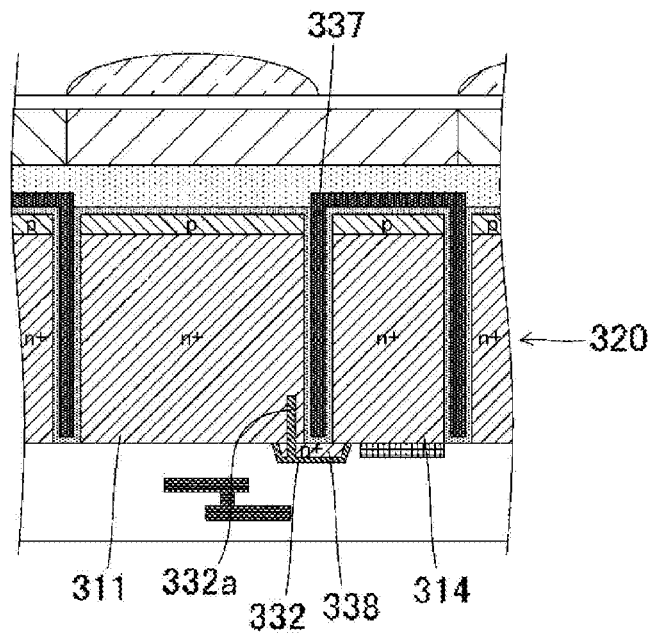
FIG. 14 is a view illustrating a cross-sectional configuration example of a pixel in A-A cross section of FIG. 13.

FIG. 13 is a view illustrating a planar configuration example of the pixel 310. FIG. 14 is a view illustrating a cross-sectional configuration example of the pixel 310 in cross section A-A of FIG. 13.

Similarly to the gate electrode 32, the gate electrode 332 is formed along the front side and the side surface of a bypass part 338, and is provided at a position and shape extending across a penetrating light-shielding film 337. Accordingly, application of a predetermined voltage to the gate electrode 332 allows the charge accumulated in a PD 311 to be transferred to a charge holding unit 314.

The gate electrode 332 includes a penetrating portion 332*a* extending in a thickness direction of a semiconductor substrate 320 along the side surface of the penetrating light-shielding film 337 on the PD 311 side. A P-type region doped with a P-type impurity is also formed in a region including the surface of the bypass part 338 and the PD 311 in contact with the penetrating portion 332*a*. Therefore, providing the penetrating portion 332a would expand a channel range formed by applying a predetermined voltage to the gate electrode 332, leading to enhancement of the charge transfer efficiency. Furthermore, the presence of the channel formed by the penetrating portion 332a makes it possible to transfer charges in deep positions of the PD 311 with high efficiency.

The penetrating portion 332a may have a shape of a flat plate member extending from the main body of the gate electrode 332 or a shape of a plurality of columnar members extending in a comb teeth shape from the main body of the gate electrode 332. The length of the penetrating portion 332a is appropriately set in accordance with the potential design of the PD 311.

A portion between the penetrating portion 332a and the semiconductor substrate 320 includes a gate insulating film, making it possible to suppress transmission of light, and this would contribute to a reduction in optical noise to the charge holding unit 314. Furthermore, the gate electrode 332 uses a metal material to be formed into a metal gate, making it possible to improve the light shielding property between the PD 311 and the charge holding unit 314, leading to further reduction of the optical noise to the charge holding unit. Examples of a material of the metal electrode include a simple substance of tungsten (W), aluminum (Al), titanium (Ti), titanium nitride (TiN), or cobalt (Co), or a stacked structure of these materials. It is of course allowable to form the penetrating portion 332a alone out of the material of the gate electrode 332 as a metal gate and form the other portion as a silicon gate.

(D) Fourth Embodiment

A solid-state imaging element 400 according to the present embodiment has a configuration similar to the above-described solid-state imaging element 100 except for a structure between the charge holding unit and the floating diffusion.

Accordingly, a structure between a charge holding unit 414 and a floating diffusion 415 of a pixel 410 of the solid-state imaging element 400 will mainly be described below, and detailed description of the other components will be omitted. In the following, reference signs having additional numbers "4" to the heads of the signs of the configuration of the solid-state imaging element 100 will be used as necessary. Note that the basic functions of the charge holding unit 414 and the floating diffusion 415 are similar to the functions of the charge holding unit 14 and the floating diffusion 15, respectively.

Figure 15:
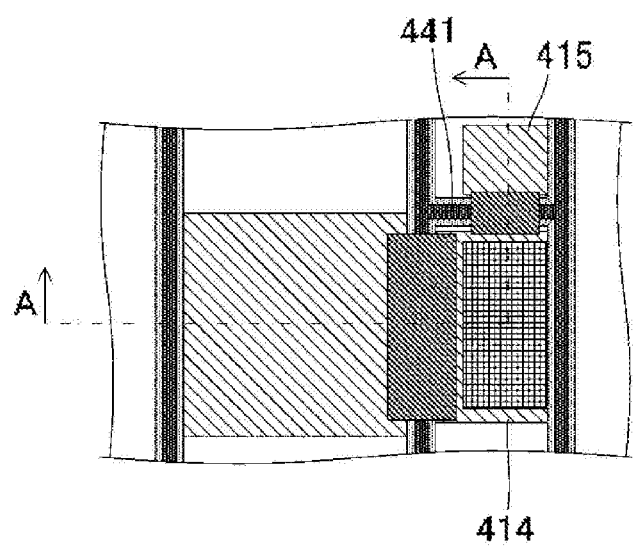
FIG. 15 is a view illustrating a planar configuration example of a pixel according to a fourth embodiment.
Figure 16:
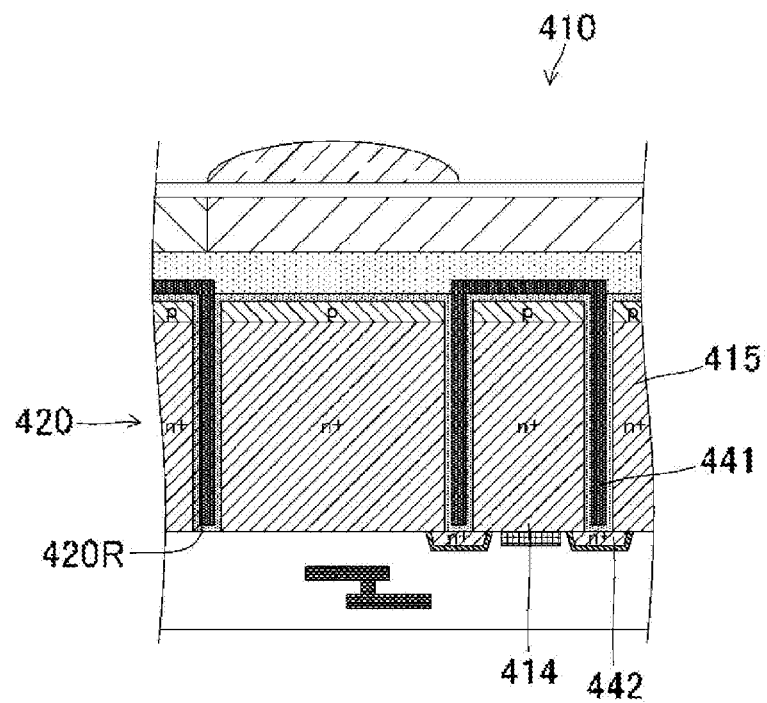
FIG. 16 is a view illustrating a cross-sectional configuration example of a pixel in A-A cross section of FIG. 15.

FIG. 15 is a view illustrating a planar configuration example of the pixel 410. FIG. 16 is a view illustrating a cross-sectional configuration example of the pixel 410 in cross section A-A of FIG. 15.

A portion between the charge holding unit 414 and the floating diffusion 415 includes a penetrating light-shielding film 441 as a second penetrating light-shielding film. Similar to a penetrating light-shielding film 437 or the like, the penetrating light-shielding film 441 is formed by depositing a high dielectric constant material film over an entire inner surface of a through hole provided in a semiconductor substrate 420 and filling a light shielding material in the through hole.

The penetrating light-shielding film 441 penetrates through the front and back surfaces of the semiconductor substrate 420 and has a structure to partition the charge holding unit 414 and the floating diffusion 415 from each other The front-side end portion of the penetrating light-shielding film 441 is formed in the thickness direction of the semiconductor substrate 420 to be substantially equal to the front-side end portion of the charge holding unit 414 or longer in the front side direction than the front-side end portion of the charge holding unit 414.

With the presence of the penetrating light-shielding film 441, it is possible to improve the light shielding property between the charge holding unit 414 and the floating diffusion 415, leading to suppression of the influence of noise from the floating diffusion 415 side to the charge holding unit 414.

Note that the charge holding unit 414 may have a structure including a penetrating light-shielding film similar to the penetrating light-shielding film 441 being provided also on the side opposite to the floating diffusion 415 of the charge holding unit 414. That is, the entire periphery the charge holding unit 414 may be surrounded by the penetrating light-shielding film. Shielding the periphery of the charge holding unit 414 with the penetrating light-shielding film in this manner makes it possible to further enhance the light shielding property of the charge holding unit 414, leading to further suppression of the influence of optical noise.

The charge holding unit 414 and the floating diffusion 415 are mutually connected by a bypass part 442 as a second bypass part formed so as to extend across the penetrating light-shielding film 441 on the outer side of the front surface 420F of the semiconductor substrate 420. The bypass part 442 is formed in positions and ranges including formation ranges of the penetrating light-shielding film 441, the charge holding unit 414, and the floating diffusion 415, individually. The bypass part 442 includes a semiconductor material doped with an N-type impurity. A gate electrode of the second transfer transistor 13 is stacked on the front surface side of the bypass part 442. Application of a predetermined voltage to this gate electrode allows the charges accumulated in the PD 411 to be transferred to the charge holding unit 414. That is, the bypass part 442 serves as a charge transfer path that transfers charges from the charge holding unit 414 to the floating diffusion 415.

(E) Fifth Embodiment

The solid-state imaging element 500 according to the present embodiment has a configuration similar to the configuration of the above-described solid-state imaging element 100, except that a light-shielding film provided on the front surface side of the charge holding unit.

Accordingly, a shape of a front surface light-shielding film 543 of the solid-state imaging element 500 will mainly be described below, and detailed description of the other components will be omitted. In the following, reference signs having additional numbers "5" to the heads of the signs of the configuration of the solid-state imaging element 100 will be used as necessary.

Figure 17:
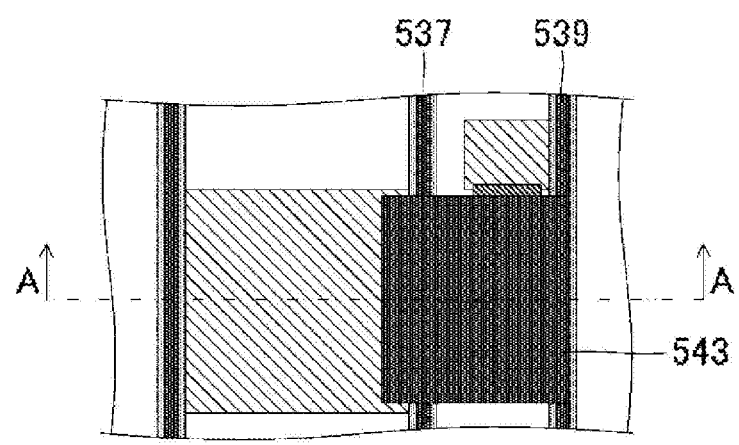
FIG. 17 is a view illustrating a planar configuration example of a pixel according to a fifth embodiment.
Figure 18:
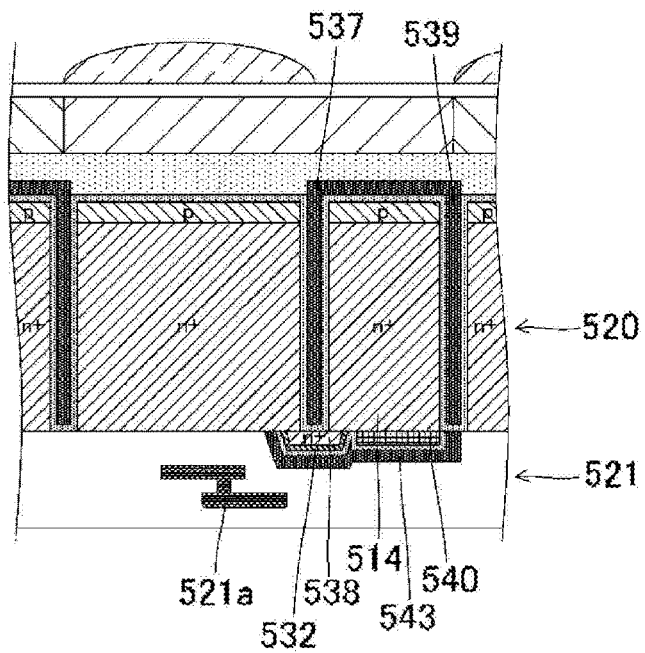
FIG. 18 is a view illustrating a cross-sectional configuration example of a pixel in A-A cross section of FIG. 17.

FIG. 17 is a view illustrating a planar configuration example of a pixel 510. FIG. 18 is a view illustrating a cross-sectional configuration example of the pixel 510 in cross section A-A of FIG. 17.

The front surface light-shielding film 543 is a member that shields light by covering the front side of a charge holding unit 514. Providing the front surface light-shielding film 543 continuous to a penetrating light-shielding film 539 would suppress light incidence from the side of the penetrating light-shielding film 539. The front surface light-shielding film 543 is formed so as to cover the front side of the charge holding unit 514 including members (a memory gate 540, a bypass part 538, a transfer electrode 532, or the like) formed between a semiconductor substrate 520 and a wiring layer 521. The range covered with the front surface light-shielding film 543 can be expanded or reduced within a range that would not electrically interfere with a contact portion connecting the semiconductor substrate 520 to the wire 521a. A high dielectric constant material film is provided between each of the front surface light-shielding film 543, the charge holding unit 514 and various members (a memory gate 540, the bypass part 538, ate transfer electrode 532, or the like). With this configuration, the light shielding property of the charge holding unit 514 can be further improved.

(F) Sixth Embodiment

A solid-state imaging element 600 according to the present embodiment has a configuration similar to the above-described solid-state imaging element 100 except for the formation range of the bypass part formed in a raised shape.

Accordingly, the formation range of a bypass part 638 of the solid-state imaging element 600 will mainly be described below, and detailed description of the other components will be omitted. In the following, reference signs having additional numbers "6" to the heads of the signs of the configuration of the solid-state imaging element 100 will be used as necessary.

Figure 19:
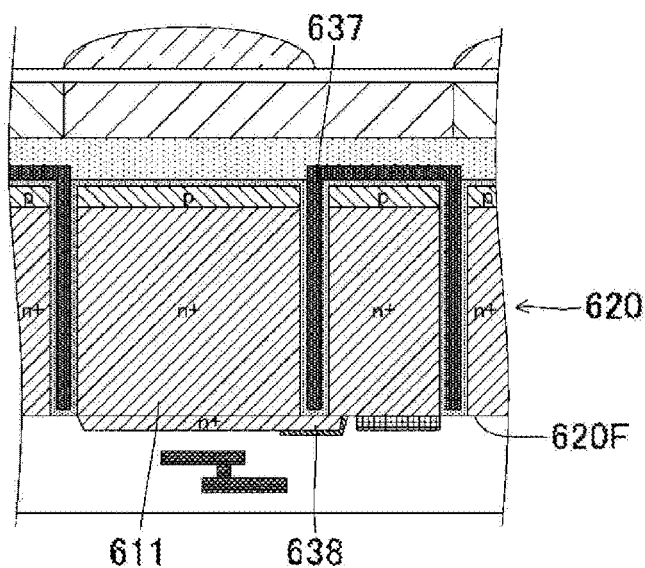
FIG. 19 is a view illustrating a cross-sectional configuration example of a pixel corresponding to the sixth embodiment in a cross section corresponding to A-A cross section of FIG. 3.

FIG. 19 is a view illustrating a cross-sectional configuration example of a pixel 610 in the cross section corresponding to the A-A cross section of FIG. 3.

The bypass part 638 has a shape extending in the formation range of the PD 611 on the front surface 620F of the semiconductor substrate 620 as well as the site extending across the penetrating light-shielding film 637. For example, the entire front surface of the PD 611 is formed to have substantially a same degree of raised shape as the shape of the front surface of the bypass part 638. This increases the volume of the PD 611, leading to an advantage of increasing the saturation charge amount of the PD 611.

(G) Seventh Embodiment

A solid-state imaging element 700 according to the present embodiment has a configuration similar to the configuration of the above-described solid-state imaging element 100 except that it employs a FD accumulating configuration in which the charge holding unit is not provided and the charge of the PD is directly transferred to the floating diffusion.

Accordingly, a structure concerning charge transfer from a PD 711 to a floating diffusion 715 of the solid-state imaging element 700 will mainly be described below, and detailed description of the other components will be omitted. In the following, reference signs having additional numbers "7" to the heads of the signs of the configuration of the solid-state imaging element 100 will be used as necessary.

Figure 20:
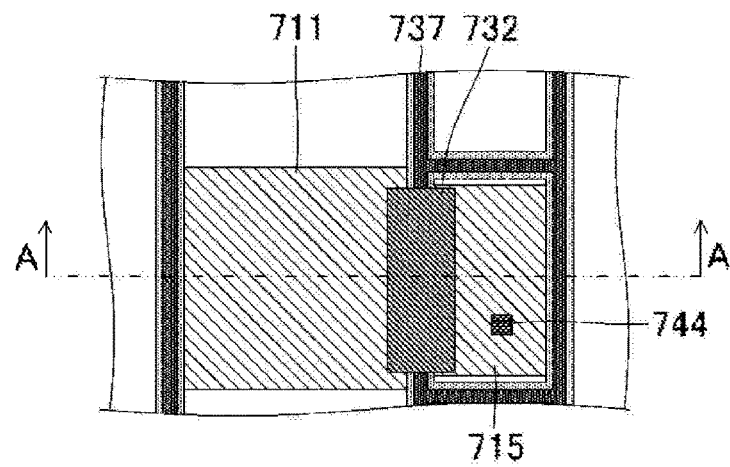
FIG. 20 is a view illustrating a planar configuration example of a pixel according to a seventh embodiment.
Figure 21:
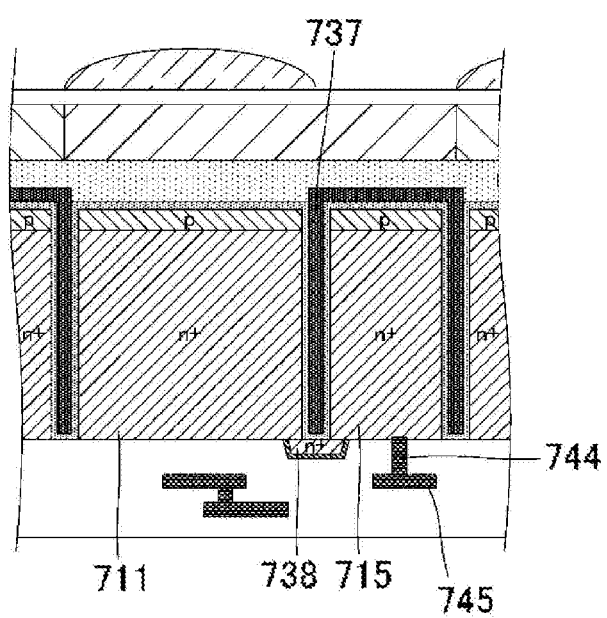
FIG. 21 is a view illustrating a cross-sectional configuration example of a pixel in A-A cross section of FIG. 20.

FIG. 20 is a view illustrating a planar configuration example of a pixel 710. FIG. 21 is a view illustrating a cross-sectional configuration example of the pixel 710 in cross section A-A of FIG. 20.

In the present embodiment, the floating diffusion 715 is provided as a configuration for receiving and holding the charges transferred from the PD 711 via a bypass part 738. That is, at least a part of the floating diffusion 715 is located on the side opposite to the PD 711 across the penetrating light-shielding film 737, and at least a portion of a formation range of the PD 711 and a formation range of the floating diffusion 715 overlap each other in the extending direction of the Penetrating light-shielding film 737. The bypass part 738 formed in this overlapping portion serves as a charge transfer path from the PD 711 to the floating diffusion 715. The charge accumulated in the floating diffusion 715 is output as a pixel signal via a contact 744 and a wire 745.

According to the solid-state imaging element 700 configured as described above, it is possible to omit a charge holding unit typically occupies a large area, leading to an advantage in the viewpoint of the chip size.

(C) Eighth Embodiment

Figure 22:
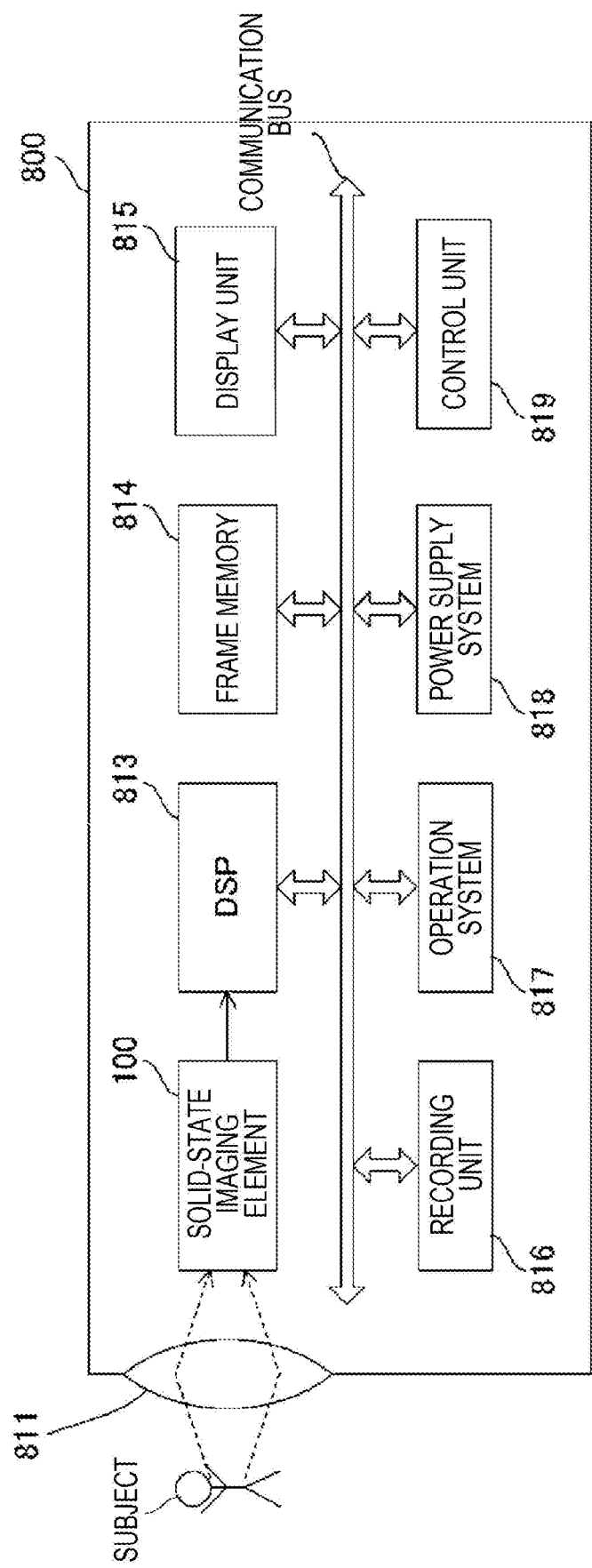
FIG. 22 is a block diagram illustrating a configuration of an imaging device.

FIG. 22 is a block diagram illustrating a configuration of an imaging device 800 including the solid-state imaging element 100. The imaging device 800 illustrated in the figure is an example of an electronic device.

Note that in the present description, an imaging device represents a general electronic device using a solid-state imaging element as an image capturing unit (photoelectric conversion unit), such as an imaging device including a digital still camera, a digital video camera, or the like, or a mobile terminal device such as a mobile phone having an imaging function. Obviously, an electronic device using a solid-state imaging element in the image capturing unit also includes a copying machine using a solid-state imaging element in an image reading unit. Furthermore, the imaging device may be a module including a solid-state imaging element so as to be mounted on the above-described electronic device.

In FIG. 22, the imaging device 800 includes an optical system 811 including a lens group, a solid-state imaging element 100, a digital signal processor (DSP) 813 as a signal processing circuit for processing output signals of the solid-state imaging element 100, a frame memory 814, a display unit 815, a recording unit 816, an operation system 817, a power supply system 818, and a control unit 819.

The DSP 813, the frame memory 814, the display unit 815, the recording unit 816, the operation system 817, the power supply system 818, and the control unit 819 are mutually connected so as to be able to exchange data and signals with each other via a communication bus.

The optical system 811 captures incident light (image light) from a subject and forms an image on an imaging surface of the solid-state imaging element 100. The solid-state imaging element 100 generates an electric signal corresponding to the amount of received incident light formed on the imaging surface by the optical system 811 in units of pixels, and outputs the generated electric signal as a pixel signal. This pixel signal is input to the DSP 813 and image data generated after having undergone various image processing appropriately is then stored in the frame memory 814, recorded on a recording medium of the recording unit 816, or output to the display unit 815.

The display unit 815 is a panel type display apparatus such as a liquid crystal display apparatus or an organic electro luminescence (EL) display apparatus, and displays moving images and still images captured by the solid-state imaging element 100, and other information. The recording unit 816 records the moving image and the still image captured by the solid-state imaging element 100 on a recording medium such as a digital versatile disk (DVD), a hard disk (HD), or a semiconductor memory.

The operation system 817 receives various operations from the user, and transmits an operation command corresponding to the operation of the user to each of the units 813, 814, 815, 816, 818, and 819 via the communication bus. The power supply system 818 generates various power supply voltages as drive power supply and supplies the voltages appropriately to supply targets (each of 813, 814, 815, 816, 817, and 819).

The control unit 819 includes a CPU that performs arithmetic processing, a ROM that stores a control program of the imaging device 800, a RAM that functions as a work area of the CPU, or the like. The control unit 819 causes the CPU to execute the control program stored in the ROM while using the RAM as a work area so as to control each of 813, 814, 815, 816, 817, and 818 via the communication bus Furthermore, the control unit 819 controls a timing generator (not illustrated) to generate various timing signals and performs control to supply the timing signals to each of units.

Note that the present technology is not limited to each of the above-described embodiments and includes configurations including mutual replacement or various modifications of combinations of individual formations disclosed in the above embodiments, configurations including mutual replacement or various modifications of combinations of individual formations disclosed in known technologies and the above embodiments, or the like. Furthermore, the technical scope of the present technology is not limited to the above-described embodiment, and it covers matters described in the claims and their equivalents.

Moreover, the present technology can also be configured as below.

(1)

A solid-state imaging element including:

a semiconductor substrate;

a photoelectric conversion unit that photoelectrically converts incident light from a back surface of the semiconductor substrate;

a charge holding unit that temporarily holds a charge generated by the photoelectric conversion unit;

a first penetrating light-shielding film penetrating through front and back surfaces of the semiconductor substrate so as to partition the photoelectric conversion unit and the charge holding unit from each other;

a first bypass part containing a semiconductor material and provided on an outer front surface of the semiconductor substrate so as to connect the photoelectric conversion unit and the charge holding unit with each other across the first penetrating light-shielding film; and a control unit that controls charge transfer from the photoelectric conversion unit to the charge holding unit via the first bypass part, in which a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

(2)

The solid-state imaging element according to (1), in which the control unit controls a control electrode provided at a position corresponding to the first penetrating light-shielding film on the first bypass part so as to control charge transfer from the photoelectric conversion unit to the charge holding unit via the first bypass part.

(3)

The solid-state imaging element according to (1), in which the control unit controls a control electrode provided at a position not corresponding to the first penetrating light-shielding film on the first bypass part so as to control charge transfer from the photoelectric conversion unit to the charge holding unit via the first bypass part.

(4)

The solid-state imaging element according to (2) or (3), in which the control electrode includes a penetrating portion extending in a thickness direction of the semiconductor substrate along a side surface of the first penetrating light-shielding film on a photoelectric conversion unit side.

(5)

The solid-state imaging element according to (4), in which the penetrating portion includes a metal material.

(6)

The solid-state imaging element according to any one of (1) to (5), in which the first bypass part includes a protrusion remaining in an embankment shape by etching a front surface of the semiconductor substrate.

(7)

The solid-state imaging element according to any one of (1) to (5), in which the first bypass part includes a protrusion stacked in an embankment shape by selective epitaxial growth on a front surface of the semiconductor substrate.

(8)

The solid-state imaging element according to (7), in which a front surface of the photoelectric conversion unit is formed to have substantially a same degree of raised shape as the shape of the front surface of the first bypass part.

(9)

The solid-state imaging element according to any one of (1) to (8), further including a light-shielding film that covers a front side of a site of the first bypass part extending across the first penetrating light-shielding film and a front side of the charge holding unit.

(10)

The solid-state imaging element according to any one of (1) to (9), in which the charge holding unit is surrounded by a penetrating light-shielding film.

(11)

The solid-state imaging element according to any one of (1) to (1)0, further including:

a floating diffusion that holds a charge transferred from the charge holding unit;

a second penetrating light-shielding film penetrating through front and back surfaces of the semiconductor substrate so as to partition the charge holding unit and the floating diffusion from each other; and a second bypass part containing a semiconductor material and provided on an outer front surface of the semiconductor substrate so as to connect the charge holding unit and the floating diffusion with each other across the second penetrating light-shielding film.

(12)

The solid-state imaging element according to any one of (1) to (1)0, in which the charge holding unit includes a capacitor.

(13)

The solid-state imaging element according to any one of (1) to (10), in which the charge holding unit includes a floating diffusion.

(14)

A solid-state imaging element manufacturing method, including:

a step of forming, on a semiconductor substrate, a photoelectric conversion unit that photoelectrically converts incident light from a back surface of the semiconductor substrate;

a step of forming a charge holding unit that temporarily holds a charge generated by the photoelectric conversion unit;

a step of forming a first penetrating light-shielding film penetrating through front and back surfaces of the semiconductor substrate so as to partition the photoelectric conversion unit and the charge holding unit from each other;

a step of forming a first bypass part containing a semiconductor material and provided on an outer front surface of the semiconductor substrate so as to connect the photoelectric conversion unit and the charge holding unit with each other across the first penetrating light-shielding film; and a step of forming a control electrode that controls charge transfer from the photoelectric conversion unit to the charge holding unit via the first bypass part, in which a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

(15)

An imaging device including a solid-state imaging element and a signal processing circuit that processes a signal from the solid-state imaging element, in which the solid-state imaging element includes: a semiconductor substrate; a photoelectric conversion unit that photoelectrically converts incident light from a back surface of the semiconductor substrate; a charge holding unit that temporarily holds a charge generated by the photoelectric conversion unit; a first penetrating light-shielding film penetrating through front and back surfaces of the semiconductor substrate so as to partition the photoelectric conversion unit and the charge holding unit from each other; a first bypass part containing a semiconductor material and provided on an outer front surface of the semiconductor substrate so as to connect the photoelectric conversion unit and the charge holding unit with each other across the first penetrating light-shielding film; and a control unit that controls charge transfer from the photoelectric conversion unit to the charge holding unit via the first bypass part, and a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

REFERENCE SIGNS LIST

10 Pixel
11 PD
12 First transfer transistor
13 Second transfer transistor
14 Charge holding unit
15 Floating diffusion (FD)
16 Amplification transistor
17 Selection transistor
18 Reset transistor
20 Semiconductor substrate
20F Front surface
20R Back surface
20a Flat portion
21 Wiring layer
21a Wire
21b Interlayer insulating film
22 Light shielding layer
23 Planarizing layer
24 Color filter layer
25 On-chip lens
32 Gate electrode
34 Inter-pixel separation region
35 Back surface light-shielding film
36 High dielectric constant material film
37 Penetrating light-shielding film
38 Bypass part
39 Penetrating light-shielding film
40 Memory gate
100 Solid-state imaging element
121 Pixel array unit
122 Vertical drive unit
123 Column processing unit
124 Drive control unit
125 Horizontal drive unit
127 Output unit
200 Solid-state imaging element
210 Pixel
211 PD
212 First transfer transistor
214 Charge holding unit
220 Semiconductor substrate
220F Front surface
232 Gate electrode
232a Recess
237 Penetrating light-shielding film
238 Bypass part
300 Solid-state imaging element
310 Pixel
311 PD
314 Charge holding unit
320 Semiconductor substrate
332 Gate electrode
332a Penetrating portion
337 Penetrating light-shielding film
338 Bypass part
400 Solid-state imaging element
410 Pixel
411 PD
414 Charge holding unit
415 Floating diffusion
420 Semiconductor substrate
437 Penetrating light-shielding film
440 Memory gate
441 Penetrating light-shielding film
442 Bypass part
500 Solid-state imaging element
510 Pixel
511 PD
514 Charge holding unit
520 Semiconductor substrate
521 Wiring layer
521a Wire
532 Transfer electrode
538 Bypass part
539 Penetrating light-shielding film
543 Front surface light-shielding film
600 Solid-state imaging element
610 Pixel
611 PD
620 Semiconductor substrate
620F Front surface
638 Bypass part
639 Penetrating light-shielding film
700 Solid-state imaging element
710 Pixel
711 PD
715 Floating diffusion 737 Penetrating light-shielding film
738 Bypass part
744 Contact
745 Wire
800 Imaging device
811 Optical system
813 DSP
814 Frame memory
815 Display unit
816 Recording unit
817 Operation system
818 Power supply system
819 Control unit
H Through hole
H1 Inner side surface
HSLn Horizontal signal line
R Resist
VSLm Vertical signal line

What is claimed is:

1. A solid-state imaging element comprising:
a semiconductor substrate;
a photoelectric conversion unit that photoelectrically converts incident light from a back surface of the semiconductor substrate;
a charge holding unit that temporarily holds a charge generated by the photoelectric conversion unit;
a first penetrating light-shielding film penetrating through front and back surfaces of the semiconductor substrate so as to partition the photoelectric conversion unit and the charge holding unit from each other;
a first bypass part containing a semiconductor material and provided on an outer front surface of the semiconductor substrate so as to connect the photoelectric conversion unit and the charge holding unit with each other across the first penetrating light-shielding film; and
a control unit that controls charge transfer from the photoelectric conversion unit to the charge holding unit via the first bypass part, wherein
a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

2. The solid-state imaging element according to claim 1, wherein the control unit controls a control electrode provided at a position corresponding to the first penetrating light-shielding film on the first bypass part so as to control charge transfer from the photoelectric conversion unit to the charge holding unit via the first bypass part.

3. The solid-state imaging element according to claim 2, wherein the control electrode includes a penetrating portion extending in a thickness direction of the semiconductor substrate along a side surface of the first penetrating light-shielding film on a photoelectric conversion unit side.

4. The solid-state imaging element according to claim 3, wherein the penetrating portion includes a metal material.

5. The solid-state imaging element according to claim 1, wherein the control unit controls a control electrode provided at a position not corresponding to the first penetrating light-shielding film on the first bypass part so as to control charge transfer from the photoelectric conversion unit to the charge holding unit via the first bypass part.

6. The solid-state imaging element according to claim 1, wherein the first bypass part includes a protrusion remaining in an embankment shape by etching a front surface of the semiconductor substrate.

7. The solid-state imaging element according to claim 1, wherein the first bypass part includes a protrusion stacked in an embankment shape by selective epitaxial growth on a front surface of the semiconductor substrate.

8. The solid-state imaging element according to claim 7, wherein a front surface of the photoelectric conversion unit is formed to have substantially a same degree of raised shape as the shape of the front surface of the first bypass part.

9. The solid-state imaging element according to claim 1, further comprising a light-shielding film that covers a front side of a site of the first bypass part extending across the first penetrating light-shielding film and a front side of the charge holding unit.

10. The solid-state imaging element according to claim 1, wherein the charge holding unit is surrounded by a penetrating light-shielding film.

11. The solid-state imaging element according to claim 1, further comprising:
a floating diffusion that holds a charge transferred from the charge holding unit;
a second penetrating light-shielding film penetrating through front and back surfaces of the semiconductor substrate so as to partition the charge holding unit and the floating diffusion from each other; and
a second bypass part containing a semiconductor material and provided on an outer front surface of the semiconductor substrate so as to connect the charge holding unit and the floating diffusion with each other across the second penetrating light-shielding film.

12. The solid-state imaging element according to claim 1, wherein the charge holding unit includes a capacitor.

13. The solid-state imaging element according to claim 1, wherein the charge holding unit includes a floating diffusion.

14. A solid-state imaging element manufacturing method, comprising:
a step of forming, on a semiconductor substrate, a photoelectric conversion unit that photoelectrically converts incident light from a back surface of the semiconductor substrate;
a step of forming a charge holding unit that temporarily holds a charge generated by the photoelectric conversion unit;
a step of forming a first penetrating light-shielding film penetrating through front and back surfaces of the semiconductor substrate so as to partition the photoelectric conversion unit and the charge holding unit from each other;
a step of forming a first bypass part containing a semiconductor material and provided on an outer front surface of the semiconductor substrate so as to connect the photoelectric conversion unit and the charge holding unit with each other across the first penetrating light-shielding film; and
a step of forming a control electrode that controls charge transfer from the photoelectric conversion unit to the charge holding unit via the first bypass part, wherein
a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

15. An imaging device comprising a solid-state imaging element and a signal processing circuit that processes a signal from the solid-state imaging element, wherein the solid-state imaging element includes: a semiconductor substrate; a photoelectric conversion unit that photoelectrically converts incident light from a back surface of the semiconductor substrate; a charge holding unit that temporarily holds a charge generated by the photoelectric conversion unit; a first penetrating light-shielding film penetrating through front and back surfaces of the semiconductor substrate so as to partition the photoelectric conversion unit and the charge holding unit from each other; a first bypass part containing a semiconductor material and provided on an outer front surface of the semiconductor substrate so as to connect the photoelectric conversion unit and the charge holding unit with each other across the first penetrating light-shielding film; and a control unit that controls charge transfer from the photoelectric conversion unit to the charge holding unit via the first bypass part, and a front-side end portion of the first penetrating light-shielding film is formed to have, in a thickness direction of the semiconductor substrate, an approximately same length as a front-side end of the charge holding unit or formed to have a longer length than in the front-side end of the charge holding unit in a front side direction.

* * * * *